United States Patent [19]

Chen et al.

[11] Patent Number: 5,153,172

[45] Date of Patent: Oct. 6, 1992

[54] METHOD FOR IN-SITU PREVENTION OF STABLE BARIUM CARBONATE FORMATION IN HIGH $T_c$ CERAMIC SUPERCONDUCTOR INCLUDING THE USE OF IODINE OR AN IODINE CONTAINING COMPOUND

[75] Inventors: Kuo-Chun Chen, Carlsbad; Khodabakhsh S. Mazdiyasni, Alpine, both of Calif.

[73] Assignee: General Atomics, San Diego, Calif.

[21] Appl. No.: 591,440

[22] Filed: Oct. 1, 1990

Related U.S. Application Data

[63] Continuation-in-part of Ser. No. 441,955, Nov. 28, 1989.

[51] Int. Cl.$^5$ ............................................. H01B 12/00
[52] U.S. Cl. ..................................... 505/1; 505/734; 505/725; 505/735; 252/521
[58] Field of Search .................. 505/1, 735, 734, 738, 505/780, 725; 252/518, 521

[56] References Cited

U.S. PATENT DOCUMENTS 4,764,357 8/1988 Sherif et al. ............................ 501/1
4,994,420 2/1991 Baney et al. ......................... 501/126

FOREIGN PATENT DOCUMENTS 0051323 2/1989 Japan ................................. 505/734
0008609 11/1988 PCT Int'l Appl. ................ 505/734

OTHER PUBLICATIONS

Ottoson et al., "Chemical Vapor Deposition of the Superconducting $YBA_2Cu_3O_{7-x}$ Phase Using Halides ... ", Appl. Phys. Lett., vol. 54, No. 24, Jun. 12, 1989.
Brahme et al., "Spectroscopic Study of High Tc Superconductors derived by Solid State and Sol–Gel Route", MRS Symp., Apr. 5–9, 1988.
Zheng et al., "Superconducting $YBA_2Cu_3O_{7-x}$ Fibers Prepared by the Sol–Gel Process", MRS Symp., Apr. 5–9, 1988.
Nasu et al., Chemistry Letters, The Chemical Society of Japan (1987), "Superconducting Y-Ba-Cu-O Films with Tc>70K", Prepared by Thermal Decomposition Technique of Y-, Ba-, and Cu-2 ethylhexanoates, pp. 2403–2404.
Gross et al., Materials Research Society Symposium Proceedings, vol. 99, (Nov. 30–Dec. 4, 1987) Gross et al., "A Versatile New Metalloorganic Spin on Process for Preparing Superconducting Thin Films".
Ozawai et al., Thermochim Acta vol. 133, pp. 11–16, "Application of Thermal Analysis to Kinetic Study of Superconducting Oxide Formation", (1988).
Gupta et al., "Preparation of Superconducting Oxide Films from Metal Trifluoroacetate Solution Precursers", AOS Symp. Ser. 377 (Chem. High Temp. Supercond. 2) pp. 265–279 (1988).
Gupta et al., Appl. Physics Letters, vol. 52, No. 24, pp. 2077–2079, "Superconducting Oxide Films with High Transition Temperature Prepared from Metal Trifluoroacetate Precursors", (1988).
Negishi et al., Thermochim Acta., vol. 140, pp. 41–48, "Thermoanalytical Investigation of Yttrium Barium Copper Oxide Superconductor", III, Preparation from Mixed 2-Ethylhexanoates of Yttrium, Barium, and Copper, (1989).
Nasu et al., J. Mater. Sci. Lett., vol. 7, No. 8, pp. 858–860, "Barium Yttrium Copper Oxide Films with Tc>80k, Prepared by the Pyrolysis of 2-Ethylhexanoate", (1988).
Vest et al., J. Solid State Chem., vol. 73, No. (1), pp. 283–285, "Superconducting Films Prepared Using the Metallorganic Decomposition Technique", (1988).
JPO Abstracts "Production of Superconductive Material", Hirano et al., Feb. 13, 1989, vol. 13, No. 63, Appl. No. 62-90958, Koka: #63-256517.
"Dissolution of $YBa_2Cu_3O_{7-x}$ in Various Solvents", Trolier et al., Am. Ceram. Soc. Bull. 67 (4) 759–62 (Apr. 1988).
"Fabrication of $YBa_2Cu_3O_{7-x}$ Fibers Using Modified Sol Gel Method", Uchikawa et al., Apr. 1988, from High Temp. Superconductors Symposium.
Man F. Yan, Ceramic Superconductors II, the American Ceramic Society, Inc., 1988, pp. 450–463.
Tomoko Goto and Masahiro Kada, Critical Current Density of $Ba_2Y_1Cu_3O_{7-x}$ Superconducting Filaments Produced by Various Suspension Spinning Conditions, Materials Research Society, Nov./Dec. 1988, pp. 1292–1296.
Haixing Zheng and J. D. Mackenzie, Superconducting $YBa_2Cu_3O_{7-x}$ Materials Prepared at Low-Temperature by Sol–Gel Process, Elsevier Science Publishers B.V., Nov. 1988, vol. 7, No. 5.6, pp. 182–184.
Tetsu Umeda, Hiromitsu Kozuka, and Sumio Sakka, Fabrication of $YBa_2Cu_3O_{7-\delta}$ Superconducting Fibers by the Sol-Gel Method, Advanced Ceramic Materials, 1988, vol. 3, No. 5, pp. 520–522.

Primary Examiner—Paul Lieberman
Assistant Examiner—Bradley A. Swope
Attorney, Agent, or Firm—Nydegger & Associates

[57] ABSTRACT

A method for preventing the formation of stable barium carbonate in ceramic superconductors of the sort which comprise a rare earth metal, barium and copper. This method is applicable to superconducting ceramics made by metallo-organic and sol-gel processes in which a hydrosol, resin or gel is heat treated to remove organic constituents. Iodine or a suitable iodine containing compound is added at a suitable point at the beginning of the heat treatment process. Initially, transient gamma copper iodide is formed which later decomposes to copper oxide without formation of stable barium carbonate. Elimination of the stable barium carbonate from the product results in improved transport current density in the superconducting ceramic.

13 Claims, No Drawings

METHOD FOR IN-SITU PREVENTION OF STABLE BARIUM CARBONATE FORMATION IN HIGH $T_c$ CERAMIC SUPERCONDUCTOR INCLUDING THE USE OF IODINE OR AN IODINE CONTAINING COMPOUND

This invention was made with Government support under contract N00014-88-C-0714 awarded by the Department of the Navy. The government has certain rights in this invention.

This is a continuation-in-part patent application of our copending patent application Ser. No. 07/441,955 filed on Nov. 28, 1989, and entitled "Method for Preparing Rare Earth-Barium-Cuprate Pre-Ceramic Resins and Superconductive Materials Prepared Therefrom".

FIELD OF THE INVENTION

The present invention relates generally to high critical temperature ceramic superconductors. More specifically, the present invention relates to methods of manufacturing high critical temperature superconductors. The present invention particularly, though not exclusively, relates to methods of preventing the formation of stable barium carbonates in high critical temperature superconductors during the manufacturing process.

BACKGROUND OF THE INVENTION

While superconductivity, the property which causes certain materials to lose both electrical resistance and magnetic permeability, was discovered in 1911, it has only recently come into significant use in commercial products.

With the development of niobium-titanium materials which could be drawn into wires, superconducting wires that had a superconducting transition critical temperature ($T_c$) above 10° K. and also possessed the ability to remain superconducting in high magnetic fields became commercially practical. Despite the great expense inherent in cooling the superconductor materials of the wires with liquid helium, those wires have nevertheless been used in the construction of superconducting electromagnets. Superconducting electromagnets are now in widespread use in many diverse applications, including medical devices, apparatus used in scientific research, and advanced electronic circuitry.

Many additional potential applications for superconductors exist which are not yet commercially feasible because of the cost of cooling the superconductor materials that are presently available in wire and thin film form. Among these potential applications are superconducting electric motors, magnetically levitated trains or other vehicles, long distance transmission of electric power, magnetic energy storage, and much smaller and more powerful computers. Superconductors having a $T_c$ above room temperature would be ideal for these applications. However, superconductor materials which could remain superconducting above the boiling temperature of liquid nitrogen, i.e., 77° K., would make many of these applications commercially practical.

In 1986 Mueller and Bednorz discovered a new class of superconducting materials having a much higher $T_c$ than the commercial niobium-based materials. Intensive, world-wide research since then has produced related materials that have a a perovskite crystal structure and a $T_c$ as high as 95° K. The basic formula of some of these materials is $R_1Ba_2Cu_3O_{7-x}$ where R is a rare earth metal and x is from 0.5 to 0. These compounds are colloquially known as "1-2-3" compounds because of the ratio of rare earth to barium to copper.

Early copper-based superconductors were prepared by mixing finely powdered rare-earth oxide, barium carbonate, and copper oxide in appropriate proportions (for example, 1.76 g. yttrium oxide, 6.17 g. barium carbonate and 3.73 g. copper oxide), pressing the admixture at 15,000 to 20,000 pounds, then sintering the mixture at a temperature of about 920°-970° C. for a few hours. The 1-2-3 superconductor materials, however, generally contain unreacted starting materials. For example, the unreacted starting materials may include stable barium carbonate, which can form porous discontinuities or microcracks in the desired crystal structure. Accordingly, the process described above does not permit the formation of wires, thin films, and the like.

Several other methods have been developed for producing 1-2-3 superconductors in the proper proportions and crystal structure. For example, coprecipitation methods have been developed which use nitrate or other salt forms of the constituents and various agents, such as sodium carbonate, potassium carbonate, citric acid, and ethylene glycol, to initiate precipitation and thereby produce superconducting powders. While this method eliminates the formation of other than the desired phase, the problem still remains that the product is a powder or sintered compact that is difficult to fabricate into wires.

Superconductor ceramic materials have also been manufactured by a solution process in which a solution that contains organometallic compounds in the appropriate molar ratios is prepared to produce the desired superconductor compositions. The solution is treated to form a viscous material and then is formed into a desired shape. The superconductor material is then heated at a sufficient temperature for a sufficient time to drive off the organic material, generally as carbon dioxide, leaving a superconducting ceramic product that has the desired shape.

A related process known as sol-gel, involves controlling the hydrolysis and polymerization of metal alkoxides to form chain-like metaloxane polymers which are shaped as desired and heat treated to drive off the organic constituents, leaving a shaped ceramic superconductor.

Unfortunately, while the solution and sol-gel processes discussed above permit the manufacture of ceramic superconductors in a variety of shapes, problems of stable barium carbonate formation within the superconductor structure remain. More particularly, during pyrolysis of the metallo-organic condensed hydrosols, resins and gels, the carbon dioxide which is consequently produced tends to react with barium to form stable barium carbonate. As is well-known in the art, stable barium carbonate reduces the transport current density in the superconducting ceramic. The present invention recognizes that the formation of stable barium carbonate in 1-2-3 superconductors can be substantially reduced.

Accordingly, it is an object of the present invention to provide a method for manufacturing a superconductor which has a minimum amount of stable barium carbonate formed in the superconductor. It is a further object of the present invention to provide a method for manufacturing a superconductor that is relatively easy and cost-effective to use.

SUMMARY OF THE INVENTION

In accordance with the present invention, a suitable amount of iodine or an iodine-containing compound is added to various metallo-organic condensed hydrosols, resins and gels at a suitable point of a superconductor manufacturing process. Then, an appropriate heat treatment schedule is applied to the metalloorganic hydrosols, resins and gels. Consequently, transient phases are formed, including gamma-copper iodide, with substantially no barium carbonate formation during pyrolysis of the organic components. The transient phases themselves decompose at higher temperatures later in the process without the formation of stable barium carbonate at the earlier lower processing temperatures.

The method of the present invention is useful with a variety of manufacturing processes for making high $T_c$ ceramic superconductors that use metalloorganic or sol-gel derived resins and gels. The preferred method includes the steps of (1) preparing starting materials, generally alkoxide/alkyl alcohol solutions of the selected rare earth metal, barium and copper and an alkyl alcohol solution of iodine, (2) refluxing a mixture of the barium and rare earth metal alkoxide/alcohol solutions in stoichiometric proportions for a suitable period, (3) adding a stoichiometric quantity of copper carboxylates/alcohol or copper trifluoroacetate isopropanol solution and continuing refluxing as a precipitate forms, (4) cooling the precipitated solution to a suitable temperature (typically 50°-60° C.) and adding a quantity of a water/isopropanol solution to dissolve and hydrolize the precipitate, (5) adding the iodine and iodine-containing solutions at an appropriate molar ratio to the rare earth metallo-organic compound, (6) concentrating the solution to produce a viscous liquid or a tenacious resin mass, (7) dissolving the mass (or thinning the liquid) in a suitable non-polar solvent to produce a viscous solution, (8) forming the solution into fibers, films or other selected shapes of pre-ceramic material and (9) heat treating the shapes in an oxygen atmosphere to form a ceramic superconducting material in three steps, at a temperature of about 100° to 200° C. for from about two (2) to sixteen (16) hours to form a gamma copper iodide, at about 250° to 400° C. for about two (2) to twenty-four (24) hours to gradually decompose the gamma copper iodide with final conversion to superconducting fibers accomplished at over 800° C. for a suitable period. Tests show no detectable barium carbonate in the product.

Iodine is effective in preventing barium carbonate formation in the manufacture of ceramic superconductors from metallo-organic and sol-gel derived resins and gels.

The rare earth metal precursor compound used may be any such metal having useful superconducting properties in this system. Typical rare earth metals include yttrium, erbium, eurobium, gadolinium, holmium, lutetium, samarium and dysprosium and mixtures thereof.

Although barium is the preferred alkaline earth metal, other suitable alkaline earth metals or alkali metals may be used in combination with barium if desired. Typical alkali and alkaline earth metals include potassium, strontium, calcium, and mixtures thereof.

Any suitable alkoxides of the rare earth metal and barium may be used. Typical alkoxides are ethoxides, propoxides, isopropoxides, butoxides, pentoxides and mixtures thereof. The isopropoxides are preferred because isopropoxides are easier to prepare and relatively more cost-effective to use.

While other suitable organic copper salts may be used, copper ethylhexanoate is preferred because it is highly soluble in many common organic solvents.

The rare earth metal, barium, copper and iodine starting materials are all preferably dissolved in quantities of the same dry alcohol, which typically may be an alkyl alcohol having two to six (2-6) carbon atoms. Typical alcohols include ethanol, propanol, isopropanol, butanol, tertiary butanol, pentanol and haxanol.

The iodine solution may use iodine in any suitable form. Typical iodine compounds include iodine, diiodine pentoxide, silver iodate, silver iodide, and mixtures thereof. Ordinarily, at least about one (1) mole iodine is used per mole of rare earth metal. Preferably, iodine crystal flakes are simply dissolved in the dry alcohol solution to the desired concentration. Best results are obtained with iodine, because of its high solubility in alcohols and other organic solvents.

The hydrolysis reaction step may use any suitable quantity of water. In general, excellent results are obtained with from about two to ten (2-10) equivalents of water.

The concentrated viscous mass or dry resin mass of pre-ceramic material, which results from concentration after the addition of the iodine solution, may be redissolved in any suitable non-polar solvent. Typical solvents include binary mixtures of isopropanol and benzene, xylene, toluene, hexane, cyclohexane, pentane, isopentane or octane. Generally, a weight ratio of isopropanol to the non-polar solvent of about one to six (1:6) to one to thirty (1:30) may be used. The solvent quantity is adjusted to provide the desired fiber drawing or film forming characteristics, or to provide desired characteristics for other methods of producing a shaped product.

Any suitable method may be used for the conversion of the pre-ceramic shapes into superconductors. Initially, the pre-ceramic resin is heated to a temperature that is sufficient to form gamma copper iodide. Preferably, the resin is heated for about two to sixteen (2-16) hours at a temperature from about 100° to 200° C. Then, the temperature is increased to gradually decompose the copper iodide to copper oxide. Preferably, the resin is heated to about 250° to 450° C. for about two to twenty-four (2-24) hours. The resin material is then heated to a much higher temperature to convert it to the superconducting ceramic, preferably to about 800° to 900° C. for about two to ten (2-10) hours. Finally, the material is sintered, preferably at about 920° to 1,000° C. for about two to thirty (2-30) hours, to improve product physical characteristics. In order to maximize oxygen content, the product is then preferably annealed at a temperature of about 360° to 500° C. for a few hours.

DETAILED DESCRIPTION OF THE PREFERRED EMBODIMENT

Details of the present invention will be further understood upon reference to the following examples, which disclose preferred embodiments of this invention. All parts and percentages are by weight, unless otherwise indicated.

EXAMPLE I

Initially, the required starting materials are prepared. An about three tenths molar (0.3M) solution of yttrium isopropoxide solution in isopropanol is prepared by reacting yttrium metal chips in dry isopropanol with a small amount of mercuric chloride and refluxing for about three (3) days at about 82° C., followed by filtering to obtain clear solution. An about three tenths molar (0.3M) solution of barium isopropoxide in isopropanol is prepared by adding barium metal to dry isopropanol and filtering the solution. Copper ethylhexanoate is mixed in dry isopropanol to produce an about three tenths molar (0.3M) solution. An iodine/isopropanol solution is prepared by dissolving iodine crystal flakes into dry isopropanol. These solutions are stored under dry nitrogen until used.

Stoichiometric amounts of the barium isopropoxide/isopropanol solution and the yttrium isopropoxide/isopropanol are calculated to give a final ceramic composition of $YBa_2Cu_3O_y$. Those amounts are pipetted into a round bottom flask. The solution is refluxed at its boiling point under nitrogen for about one (1) hour. The stoichiometric amount of copper ethylhexanoate/isopropanol solution is then added. A green precipitate forms and is kept at the boiling temperature for an additional eight (8) hours under dry nitrogen. The temperature of the precipitated solution is then reduced to about 60° C. A water/isopropanol solution is prepared using four (4) equivalents of water per mole of yttrium isopropoxide. This solution is added to the flask, gradually dissolving the precipitate and forming a dark green homogeneous solution. This solution is stirred for about four (4) hours at about 60° C. To this solution is then added a quantity of the iodine starting solution sufficient to provide about one and a half (1.5) mole of iodine per mole of yttrium. This solution is immediately concentrated on a rotary concentrator. A brownish highly viscous liquid is obtained. This viscous liquid is further concentrated in a vacuum oven to a tenacious resin mass.

The resin mass is redissolved in sufficient benzene/isopropanol mixture to produce a solution which is about two (2) wt % isopropanol, about eighty-five (85) wt % resin and the balance benzene to total one hundred (100) wt %. Fibers are drawn by hand dipping a glass rod and drawing the viscous solution. The resulting pre-ceramic fibers are found to have sufficient green strength to resist breaking on gentle handling.

The pre-ceramic fibers are calcined in an oxygen atmosphere at about 150° C. for about sixteen (16) hours to form gamma copper iodide, then heat treated at about 400° C. for about twenty-four (24) hours, during which the gamma copper iodide gradually decomposes to copper oxide. No barium carbonate is observed in this material. The fibers are then converted to yttrium barium cuprate superconducting fibers by heat treating in dry oxygen at about 910° C. for about ten (10) hours and then sintered at about 970° C. for up to twenty-four (24) hours followed by annealing at about 400° C. for about eighteen (18) hours to maximize the oxygen content. Fibers having excellent strength and superconducting properties with no observable barium carbonate result.

EXAMPLE II

The experiment of Example I is repeated, except that the step of adding the iodine starting solution to the dark green hydrolized solution is omitted. Stable barium carbonate is found to have formed in the material during the pyrolysis steps. The transport current density of the superconducting fiber product is found to have been adversely affected.

EXAMPLE III

Initially, the required starting materials are prepared. An about one tenth molar (0.1M) solution of erbium isopropoxide solution in isopropanol is prepared by reacting erbium metal chips in dry isopropanol with a small amount of mercuric chloride and refluxing for about three (3) days, followed by filtering to obtain a clear solution. An about one tenth molar (0.1M) solution of barium isopropoxide in isopropanol is prepared by adding barium metal to dry isopropanol and filtering the solution. Copper ethylhexanoate is mixed in dry isopropanol to produce an about one tenth molar (0.1M) solution. An iodine/isopropanol solution is prepared by dissolving iodine crystal flakes into dry isopropanol. These solutions are stored under dry nitrogen until used.

Stoichiometric amounts of the barium isopropoxide/isopropanol solution and the erbium isopropoxide/isopropanol are calculated to give a final ceramic composition of $ErBa_2Cu_3O_y$. Those amounts are pipetted into a round bottom flask. The solution is refluxed at its boiling point under nitrogen for about one (1) hour. The stoichiometric amount of copper ethylhexanoate/isopropanol solution is then added. A green precipitate forms and is kept at the boiling temperature for an additional two (2) hours under dry nitrogen. The temperature of the precipitated solution is reduced to about 50° C. A water/isopropanol solution is prepared using five (5) equivalents of water per mole of erbium isopropoxide. This solution is added to the flask, gradually dissolving the precipitate and forming a dark green homogeneous solution. This solution is stirred for about five (5) hours at about 50° C. To this solution is then added a quantity of the iodine starting solution sufficient to provide about one (1) mole of iodine per mole of erbium. This solution is immediately concentrated on a rotary concentrator. A highly viscous liquid is obtained. This viscous liquid is further concentrated in a vacuum oven to a tenacious resin mass.

The resin mass is redissolved in sufficient toluene/isopropanol mixture to produce a solution which is about two (2) wt % isopropanol, about eighty-five (85) wt % resin and the balance toluene to total one hundred (100) wt %. Fibers are drawn by hand dipping a glass rod and drawing the viscous solution. The resulting pre-ceramic fibers are found to have sufficient green strength to resist breaking on gentle handling.

The pre-ceramic fibers are calcined in an oxygen atmosphere at about 150° C. for about four (4) hours to form gamma copper iodide, then heat treated at about 300° C. for about four (4) hours, during which the gamma copper iodide gradually decomposes to copper oxide. No barium carbonate is observed in the material. The fibers are then converted to erbium barium cuprate superconducting fibers by heat treating in dry oxygen at about 800° C. for about six (6) hours and then sintered at about 920° C. for about twenty (20) hours, then annealed at about 450° C. for about eighteen (18) hours to maximize the oxygen content. Fibers having excellent strength and superconducting properties with no observable barium carbonate result.

EXAMPLE IV

The experiment of Example III is repeated, except that the iodine starting solution is not added to the dark green hydrolized solution. Stable barium carbonate is found to have formed in the material during the pyrolysis steps.

Various specific materials, quantities and conditions have been detailed in the above examples of preferred embodiments. These may be varied, where suitable, with similar results. For example, various additives may be added at appropriate points in the method to cause desired modifications in the final product. Also, shapes other than fibers, such as films, tapes or other structures, may be produced if desired.

Other applications, ramifications and modifications of the above-described method and products will occur to those skilled in the art upon reading this disclosure. Those are intended to be included within the scope of this invention, as defined in the appended claims.

We claim:

1. A method of making a pre-ceramic resinous material capable of being converted into a ceramic semiconductor material substantially free from stable barium carbonate and having the general composition $RR'_2Cu_3O_{7-x}$ where R is a rare earth meta, R' is an alkaline earth metal, and x is from 0 to 0.5, the method comprising:

refluxing stoichiometric amounts of a first solution comprising a rare earth isopropoxide and an alkaline earth isopropoxide in isopropanol;

adding to said first solution a stoichiometric amount of a second solution comprising copper ethylhexanoate in isopropanol;

refluxing said first and second solutions to obtain a precipitate;

hydrolyzing said precipitate in a quantity of a first solvent comprising water and isopropanol sufficient to substantially dissolve said precipitate into a precipitate solution;

adding a third solution comprising an iodine compound in an alcohol to said precipitate solution to form a precursor solution having at least about 1 mole of iodine per mole of rare earth metal;

concentrating said precursor solution by removing a sufficient amount of solvents to produce the pre-ceramic resinous material; and adding a second solvent comprising a nonpolar solvent to the pre-ceramic resinous material to obtain a desired viscosity of the material.

2. The method according to claim 1 wherein said iodine compound is selected from a group consisting of iodine crystals, diiodine pentoxide, silver iodate, silver iodide, and mixtures thereof.

3. The method according to claim 1 wherein said rare earth metal is selected from the group consisting of yttrium, erbium, europium, gadolinium, holmium, lutetium, neodymium, samarium, dysprosium and mixtures thereof.

4. The method according to claim 3 wherein said rare earth metal is yttrium.

5. The method according to claim 1 wherein said alkaline earth metal is barium.

6. A method for making a ceramic superconductor material substantially free from stable barium carbonate and having the general composition $RR'_2Cu_3O_{7-x}$ is a rare earth metal, R' is an alkaline earth metal, and x is from 0 to 0.5, the method comprising:

refluxing stoichiometric amounts of a first solution comprising a rare earth isopropoxide and an alkaline earth isopropoxide in isopropanol;

adding to said first solution a stoichiometric amount of a second solution comprising copper ethylhexanoate in isopropanol;

refluxing said first and second solutions to obtain a precipitate;

hydrolyzing said precipitate in a quantity of a first solvent comprising water and isopropanol sufficient to substantially dissolve said precipitate into a precipitate solution;

adding a third solution comprising an iodine compound in an alcohol to said precipitate solution to form a precursor solution having at least about 1 mole of iodine per mole of rare earth metal;

concentrating said precursor solution by removing a sufficient amount of solvents to produce the pre-ceramic resinous material;

adding a second solvent comprising ak nonpolar solvent to the pre-ceramic resinous material to obtain a desired viscosity of the material;

forming the viscous pre-ceramic resinous material into a desired product shape;

heating the product shape in an oxygen atmosphere to a first temperature for a sufficient time to form gamma copper iodide in said pre-ceramic resinous material;

heating the product shape in an oxygen atmosphere to a second temperature higher than said first temperature for a sufficient time to decompose said gamma copper iodide in said pre-ceramic resinous material to copper oxide;

heating said product shape in dry oxygen at a temperature of from about 800° to 900° C. for from about 2 to 10 hours to convert said pre-ceramic material to said ceramic superconductor material;

sintering said product shape at about 920° to 1,000° C. for about 2 to 24 hours; and annealing said product shape at a temperature of about 360° to 500° C. for about 4 to 48 hours whereby a final superconducting article ready for use results.

7. The method according to claim 6 wherein said shapes are heated to form said gamma copper iodide at said first temperature of from about 100° to 200° C. for from about 2 to 16 hours.

8. The method according to claim 6 wherein said shapes are heated to decompose said gamma copper iodide to copper oxide at said second temperature of from about 250° to 450° C. for from about 2 to 24 hours.

9. The method according to claim 6 wherein said iodine solution comprises iodine in the form of iodine crystals, diiodine pentoxide, silver iodate, silver iodide, and mixtures thereof.

10. The method according to claim 6 wherein said rare earth metal is selected from the group consisting of yttrium, erbium, europium, gadolinium, holmium, lutetium, neodymium, samarium, dysprosium and mixtures thereof.

11. The method according to claim 10 wherein said rare earth metal is yttrium.

12. The method according to claim 6 wherein said alkaline earth metal is barium.

13. The method according to claim 6 wherein R is yttrium and R' is barium.

* * * * *